United States Patent
He et al.

(10) Patent No.: US 12,191,171 B2
(45) Date of Patent: Jan. 7, 2025

(54) APPARATUS FOR THERMALLY PROCESSING A SUBSTRATE

(71) Applicant: United Semiconductor (Xiamen) Co., Ltd., Fujian (CN)

(72) Inventors: Xin Zhi He, Fujian (CN); Wen Yi Tan, Fujian (CN)

(73) Assignee: United Semiconductor (Xiamen) Co., Ltd., Fujian (CN)

(*) Notice: Subject to any disclaimer, the term of this patent is extended or adjusted under 35 U.S.C. 154(b) by 606 days.

(21) Appl. No.: 17/555,484

(22) Filed: Dec. 19, 2021

(65) Prior Publication Data

US 2023/0140032 A1 May 4, 2023

(30) Foreign Application Priority Data

Nov. 2, 2021 (CN) .......................... 202122663379.2

(51) Int. Cl.
 *H01L 21/67* (2006.01)
 *H05B 31/02* (2006.01)

(52) U.S. Cl.
 CPC ........ *H01L 21/67115* (2013.01); *H05B 31/02* (2013.01)

(58) Field of Classification Search
 CPC ......... H01L 21/67115; H01L 21/67248; H05B 31/02; F27B 5/18; F27B 5/14
 See application file for complete search history.

(56) References Cited

U.S. PATENT DOCUMENTS

| | | | |
|---|---|---|---|
| 6,016,383 A * | 1/2000 | Gronet | F27B 17/0025 392/416 |
| 11,764,087 B2 * | 9/2023 | Lim | H01L 21/02255 257/467 |
| 2010/0059497 A1 * | 3/2010 | Ranish | F27B 17/0025 219/400 |

* cited by examiner

*Primary Examiner* — Anne M Hines
(74) *Attorney, Agent, or Firm* — Winston Hsu

(57) ABSTRACT

An apparatus for thermally processing a substrate includes a substrate support for holding the substrate and lamps disposed above the substrate support. The lamps are grouped into concentric lamp zones including a center zone comprised of a center lamp and peripheral lamps surrounding the center lamp. A center sleeve is coupled to the center lamp and peripheral sleeves are coupled to the peripheral lamps, respectively, for directing radiated heat to the substrate during thermal processing. The center sleeve has a higher surface roughness than that of the peripheral sleeves.

8 Claims, 2 Drawing Sheets

APPARATUS FOR THERMALLY PROCESSING A SUBSTRATE

BACKGROUND OF THE INVENTION

1. Field of the Invention

The present invention relates to the field of semiconductor technology, especially an improved rapid thermal processing apparatus for processing a wafer.

2. Description of the Prior Art

Single wafer rapid thermal processing (RTP) has become one of the key technologies in semiconductor manufacturing due to its faster wafer processing with precise control of the thermal budget.

Rapid thermal processing (RTP) is typically performed by irradiating a wafer with light from an array of high-intensity lamps directed at the front face of the wafer on which the integrated circuits are being formed. The radiation is at least partially absorbed by the wafer and quickly heats it to a desired high temperature, for example above 600° C. or in some applications above 1000° C. The radiant heating can be quickly turned on and off to controllably heat the wafer over a relatively short period, for example, of a minute or less or even a few seconds.

It is important to control the temperature across the wafer to a closely defined temperature uniform across the wafer. However, the prior art rapid thermal processing often encounters local temperature uniformity, especially at the center of the wafer.

SUMMARY OF THE INVENTION

It is one object of the present invention is to provide an improved wafer thermal processing apparatus to solve the above-mentioned shortcomings or deficiencies of the prior art.

One aspect of the invention provides an apparatus for thermally processing a substrate including a substrate support for holding the substrate, and a plurality of lamps disposed above the substrate support. The plurality of lamps is grouped into concentric lamp zones including a center zone comprised of a center lamp and peripheral lamps surrounding the center lamp. A plurality of reflective sleeves including a center sleeve coupled to the center lamp and peripheral sleeves is coupled to the peripheral lamps, respectively, for directing radiated heat to the substrate during thermal processing. The center sleeve has a surface roughness higher than that of the peripheral sleeves.

According to some embodiments, the plurality of lamps is tungsten-halogen lamps.

According to some embodiments, the substrate support comprises an edge ring, and the substrate is supported on its periphery by the edge ring.

According to some embodiments, the edge ring comprises an annular sloping shelf contacting corner of the substrate.

According to some embodiments, the center lamp is surrounded by six peripheral lamps.

According to some embodiments, the center sleeve has a surface roughness of about 0.8-3.2 Ra, while the peripheral sleeves have a surface roughness of smaller than 0.4 Ra.

According to some embodiments, the center sleeve and the peripheral sleeves comprise copper and gold.

According to some embodiments, a transparent quartz window is disposed between the plurality of reflective sleeves and the substrate support.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
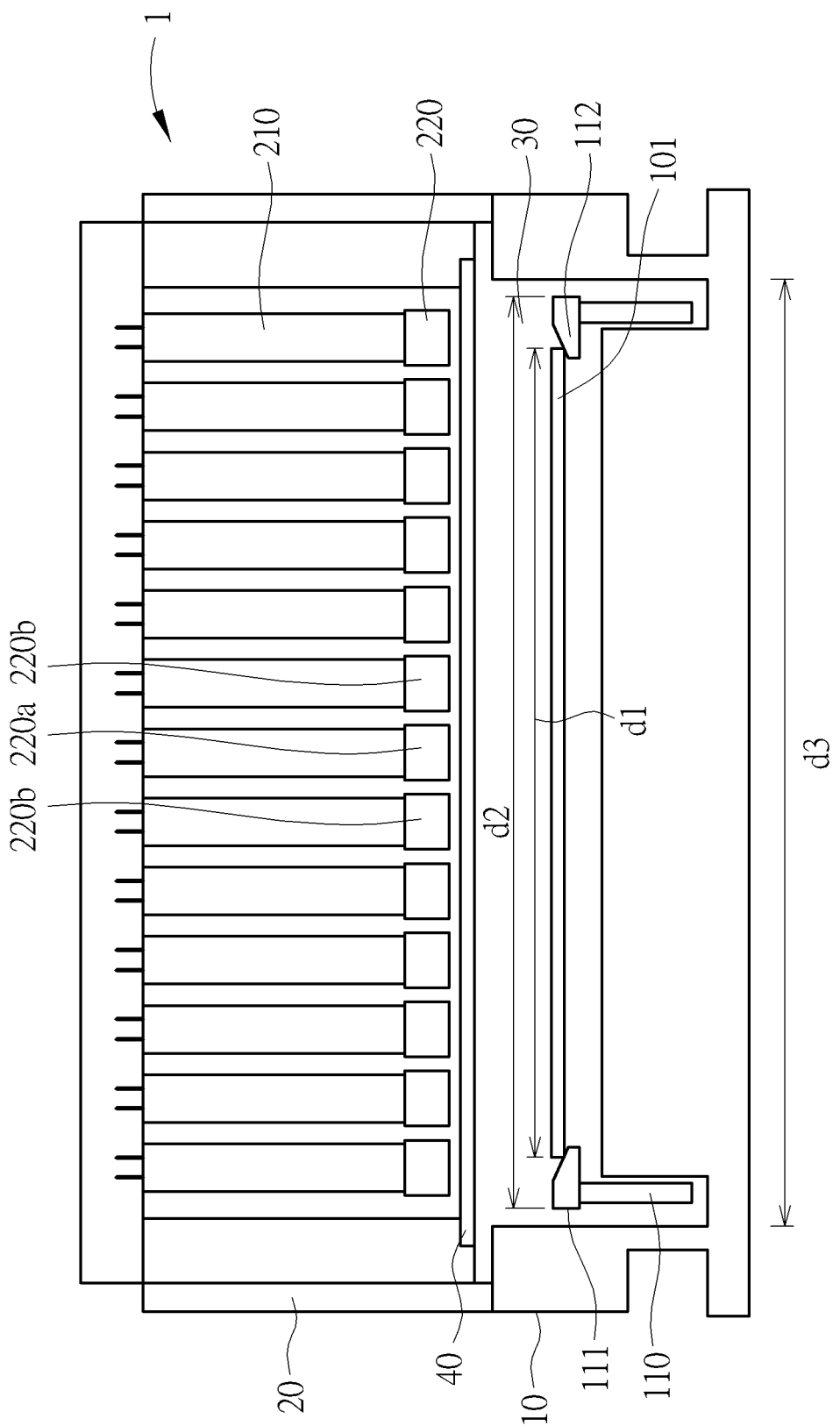
FIG. 1 is a schematic cross-sectional view of a single-wafer thermal processing apparatus according to one embodiment of the present invention.
Figure 2:
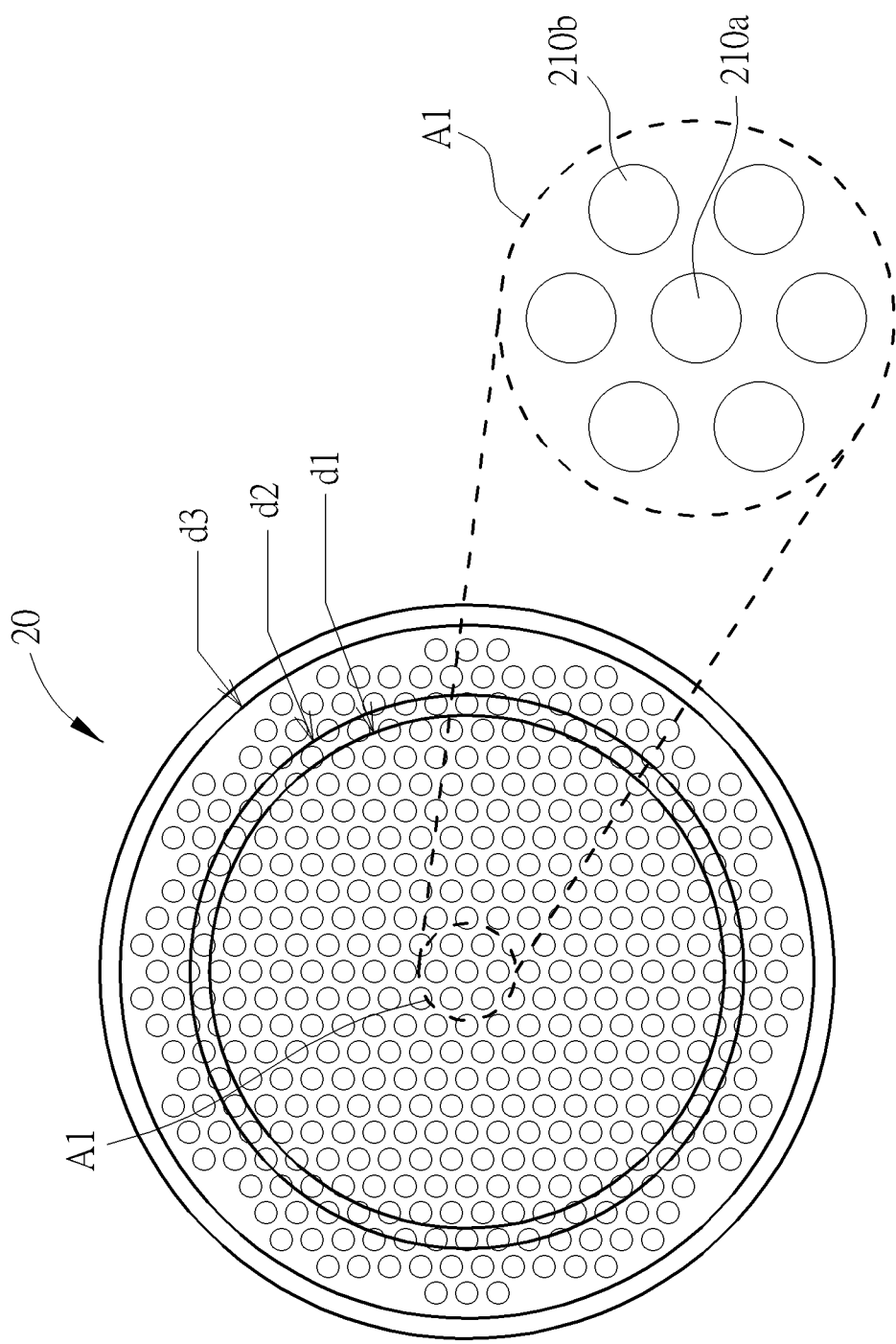
FIG. 2 is a top view of a heating source composed of the lamp array in FIG. 1.

Please refer to FIG. 1 and FIG. 2. FIG. 1 is a schematic cross-sectional view of a single-wafer thermal processing apparatus according to one embodiment of the present invention. FIG. 2 is a top view of a heating source composed of the lamp array in FIG. 1. As shown in FIG. 1 and FIG. 2, the apparatus 1 for thermally processing wafers according to the present invention includes a body 10 and a heating source 20. According to an embodiment, the heating source 20 covers the body 10 to form an enclosed processing area 30.

According to an embodiment, a substrate support 110 is provided in the body 10 for holding a substrate 101, for example, a semiconductor substrate or a silicon wafer. According to an embodiment, the substrate support 110 is rotatable. According to an embodiment, the substrate support 110 includes an edge ring 111 and the substrate 101 is supported by the edge ring 111 on its periphery. According to an embodiment, the edge ring 111 includes an annular sloping shelf 112 contacting the lower corner along the periphery of the substrate 101. It can be seen from FIG. 1 and FIG. 2 that the substrate 101 has a smaller diameter d1, the edge ring 111 has a slightly larger outer diameter d2, and the inner diameter of the body 10 is d3, wherein d3 is greater than d2, and d2 is greater than d1.

According to an embodiment, the heating source 20 includes a plurality of densely arranged lamps 210 arranged directly above the substrate support 110. According to an embodiment, the lamps 210 are tungsten-halogen lamps. As shown in FIG. 2, the lamps 210 are divided into a plurality of concentric lamp areas, and the center zone A1 includes a center lamp 210a and peripheral lamps 210b surrounding the center lamp 210a. According to an embodiment, the center zone A1 contains only seven lamps, and the center lamp 210a is surrounded by six peripheral lamps 210b.

According to an embodiment, as shown in FIG. 1, the heating source 20 further includes a plurality of reflective sleeves 220 respectively connected to the lower ends of the lamps 210 for directing heat radiation to the substrate 101 during the heat treatment. According to an embodiment, a transparent quartz window 40 is provided between the reflective sleeves 220 and the substrate support 110.

According to an embodiment, the reflective sleeves 220 comprise copper and gold, but not limited thereto. According to an embodiment, the reflective sleeves 220 are composed of copper and gold. The reflective sleeves 220 include a center sleeve 220a connected to the center lamp 210a and peripheral sleeves 220b respectively connected to the peripheral lamps 210b. The surface roughness of the center sleeve 220a is higher than that of the peripheral sleeves 210b.

According to an embodiment, the surface roughness of the inner surface of the center sleeve 210a is about 0.8-3.2 Ra (Ra: arithmetic average roughness), and the surface roughness of the inner surface of each peripheral sleeve 210b is less than 0.4 Ra. According to an embodiment, the inner surface of the center sleeve 210a may be subjected to sandblasting treatment to achieve the desired surface roughness.

Since the surface roughness of the center sleeve 210a is relatively higher, the reflection of the center sleeve 210a can be reduced, thereby improving the local temperature uniformity of the wafer under thermal treatment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for thermally processing a substrate, comprising:
    a substrate support for holding the substrate;
    a plurality of lamps disposed above the substrate support, wherein the plurality of lamps is grouped into concentric lamp zones including a center zone comprised of a center lamp and peripheral lamps surrounding the center lamp; and
    a plurality of reflective sleeves including a center sleeve coupled to the center lamp and peripheral sleeves coupled to the peripheral lamps, respectively, for directing radiated heat to the substrate during thermal processing, wherein the center sleeve has a surface roughness higher than that of the peripheral sleeves.

2. The apparatus according to claim 1, wherein the plurality of lamps is tungsten-halogen lamps.

3. The apparatus according to claim 1, wherein the substrate support comprises an edge ring, and wherein the substrate is supported on its periphery by the edge ring.

4. The apparatus according to claim 3, wherein the edge ring comprises an annular sloping shelf contacting corner of the substrate.

5. The apparatus according to claim 1, wherein the center lamp is surrounded by six peripheral lamps.

6. The apparatus according to claim 1, wherein the center sleeve has a surface roughness of about 0.8-3.2 Ra, while the peripheral sleeves have a surface roughness of smaller than 0.4 Ra.

7. The apparatus according to claim 1, wherein the center sleeve and the peripheral sleeves comprise copper and gold.

8. The apparatus according to claim 1, wherein a transparent quartz window is disposed between the plurality of reflective sleeves and the substrate support.

* * * * *